US009645330B2

(12) United States Patent
Kon et al.

(10) Patent No.: US 9,645,330 B2
(45) Date of Patent: May 9, 2017

(54) OPTICAL MODULE

(71) Applicant: Enplas Corporation, Saitama (JP)

(72) Inventors: Ayano Kon, Saitama (JP); Shimpei Morioka, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 15/106,934

(22) PCT Filed: Dec. 22, 2014

(86) PCT No.: PCT/JP2014/083846
§ 371 (c)(1),
(2) Date: Jun. 21, 2016

(87) PCT Pub. No.: WO2015/098802
PCT Pub. Date: Jul. 2, 2015

(65) Prior Publication Data
US 2017/0038539 A1    Feb. 9, 2017

(30) Foreign Application Priority Data

Dec. 24, 2013  (JP) .................................. 2013-265288

(51) Int. Cl.
*G02B 6/36*    (2006.01)
*G02B 6/38*    (2006.01)
(Continued)

(52) U.S. Cl.
CPC .............. *G02B 6/424* (2013.01); *G02B 6/32* (2013.01); *G02B 6/4204* (2013.01); *G02B 6/425* (2013.01);
(Continued)

(58) Field of Classification Search
CPC ...... G02B 6/32; G02B 6/4201; G02B 6/4204; G02B 6/4214; G02B 6/4219; G02B 6/424;
(Continued)

(56) References Cited

U.S. PATENT DOCUMENTS

2014/0270651 A1*  9/2014  Kadar-Kallen ...... G02B 6/3861
385/79

FOREIGN PATENT DOCUMENTS

JP    2005-189257 A    7/2005
JP    2005-317658 A    11/2005
(Continued)

OTHER PUBLICATIONS

International Search Report from International Application No. PCT/JP2014/083846 mailed Mar. 31, 2015.

*Primary Examiner* — Akm Enayet Ullah
*Assistant Examiner* — Michael Mooney
(74) *Attorney, Agent, or Firm* — Brundidge & Stanger, P.C.

(57) ABSTRACT

This optical module comprises a substrate, light-emitting elements, a ferrule, an optical receptacle, through-holes and an adhesive. The optical receptacle includes two support units, and an optical receptacle body that has a first optical surface and a second optical surface. The through-holes include two first through-holes surrounded by the leading ends of the support units and the ferrule, and two second through-holes which are surrounded by the optical receptacle body, the support units and the ferrule. Thus, even using the adhesive to fix the optical receptacle and the ferrule to the substrate, it is possible to optically connect multiple optical transmission bodies with multiple light-emitting elements or multiple light-receiving elements in a suitable manner.

4 Claims, 5 Drawing Sheets

(51) Int. Cl.
 *G02B 6/32* (2006.01)
 *G02B 6/42* (2006.01)
(52) U.S. Cl.
 CPC ......... *G02B 6/4214* (2013.01); *G02B 6/4219* (2013.01); *G02B 6/4228* (2013.01); *G02B 6/4239* (2013.01); *G02B 6/4249* (2013.01)
(58) Field of Classification Search
 CPC .. G02B 6/4228; G02B 6/4239; G02B 6/4249; G02B 6/425
 USPC .................................. 385/33, 53–78, 88–94
 See application file for complete search history.

(56) References Cited

FOREIGN PATENT DOCUMENTS

| | | |
|---|---|---|
| JP | 2010-175942 A | 8/2010 |
| JP | 2012-108443 A | 6/2012 |
| WO | 2013/183273 A1 | 12/2013 |

\* cited by examiner

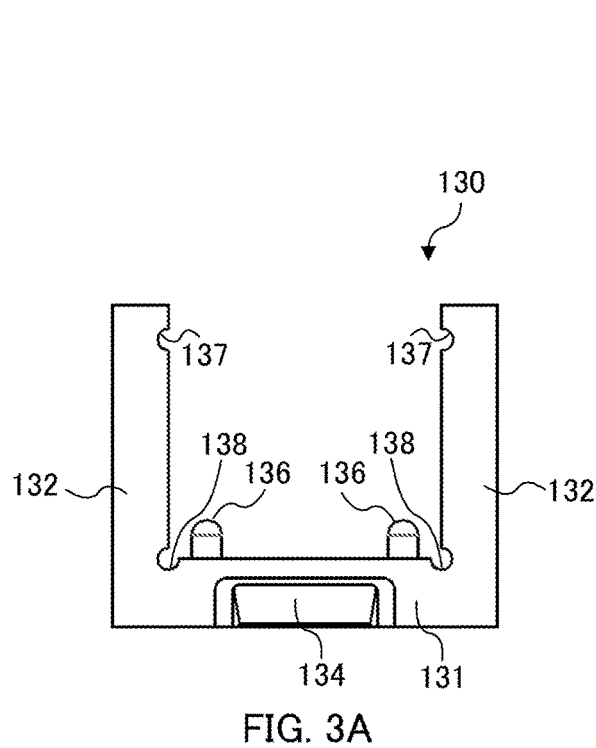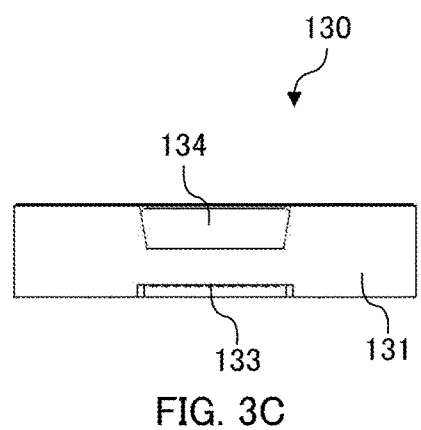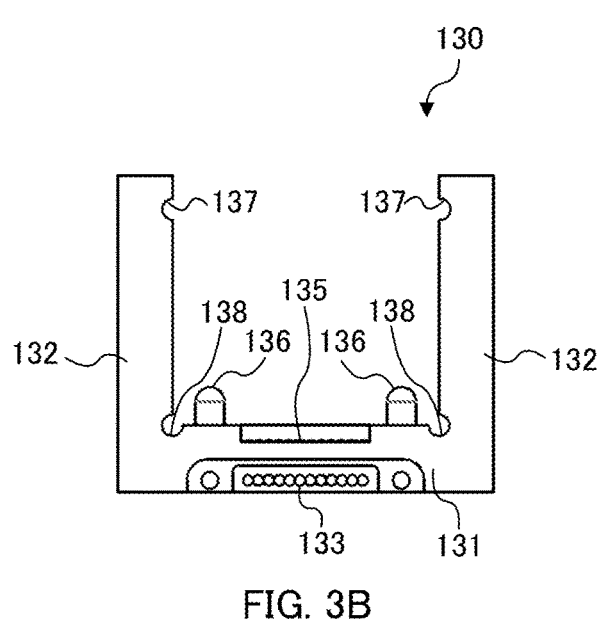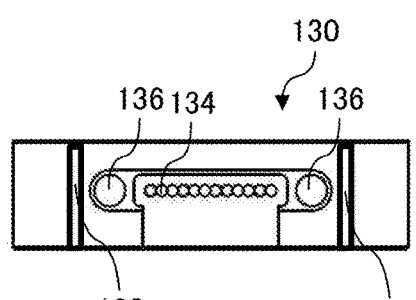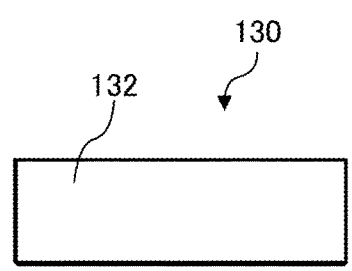

OPTICAL MODULE

TECHNICAL FIELD

The present invention relates to an optical module including an optical receptacle.

BACKGROUND ART

In optical communications using optical transmission members such as optical fibers and light waveguides, optical modules have been used, provided with a light emitting element such as a surface-emitting laser (for example, VCSEL: Vertical Cavity Surface Emitting Laser). Such an optical module includes an optical receptacle that allows light including communication information emitted from a light emitting element to be incident on the end surface of an optical transmission member.

For example, PTL 1 discloses an optical module including an optical connector and a substrate with light emitting elements disposed thereon. The optical connector includes optical fibers and a connector part including a lens array (optical receptacle) disposed between the tips of the plurality of the optical fibers and the light emitting elements. The lens array includes a reflecting mirror that reflects light emitted from the light emitting elements toward the optical fiber tips, and a condenser lens that concentrates the light reflected by the reflecting mirror toward the optical fiber tips.

In the optical module disclosed in PTL 1, the optical connector is fixed to the substrate by positioning the optical connector at a certain position in the substrate, putting a thermosetting epoxy resin adhesive on the boundary between the lens array edges and the substrate, and heat curing the adhesive.

In an optical module produced in such a manner, light emitted from a light emitting element is reflected by a reflecting mirror toward an optical fiber tip, and reaches the optical fiber tip via a condenser lens.

CITATION LIST

Patent Literature

PTL 1
Japanese Patent Application Laid-Open No. 2010-175942

SUMMARY OF INVENTION

Technical Problem

However, when the epoxy resin adhesive is cured in the optical module disclosed in PTL 1, the lens array (condenser lens and reflecting mirror) is deformed as if the lens array is pulled toward the epoxy resin adhesive side (i.e., laterally) by the shrinkage of the epoxy resin adhesive. The epoxy resin adhesive is cured with the lens array in the deformed state. The lens array is thus kept in the deformed state after fixed to the substrate, which may lead to light emitted from the light emitting element not properly guided to the end surface of the optical fiber. As described above, the lens array (optical receptacle) disclosed in PTL 1 is disadvantageously deformed when fixed with an adhesive.

An object of the present invention is to provide an optical module including an optical receptacle that is not easily deformed even when the optical receptacle is fixed using an adhesive.

Solution to Problem

An optical module of the present invention includes: a substrate; a plurality of light emitting elements or a plurality of light receiving elements arrayed on the substrate; a ferrule which holds a plurality of optical transmission members being configured to receive light respectively from the plurality of light emitting elements or to emit light respectively to the plurality of light receiving elements; an optical receptacle which is disposed on the substrate, with the ferrule being fixed to the optical receptacle, the optical receptacle being configured to optically couple the plurality of light emitting elements or the plurality of light receiving elements to the plurality of optical transmission members, respectively; four through holes formed in a boundary between the ferrule and the optical receptacle in a direction substantially perpendicular to the substrate; and an adhesive filled into the four through holes to adhere the ferrule and the optical receptacle to the substrate, in which the optical receptacle includes: an optical receptacle body including a plurality of first optical surfaces which are configured such that light emitted from the plurality of light emitting elements is respectively incident on the first optical surface or are configured to emit light propagating inside the optical receptacle body respectively toward the plurality of light receiving elements, and a plurality of second optical surfaces which are configured to emit the light incident on the plurality of first optical surfaces respectively toward an end surface of the plurality of optical transmission members or are configured such that light from the plurality of optical transmission members is respectively incident on the second optical surface, the optical receptacle body having the ferrule being fixed to a rear surface thereof such that the plurality of optical transmission members face the plurality of second optical surfaces, respectively, and two supporters disposed on both side surfaces of the ferrule, respectively, the two supporters each having a base end connected to the optical receptacle body, and the four through holes include: two first through holes each surrounded by a tip portion of each of the supporters and the ferrule, and two second through holes each surrounded by the optical receptacle body, each of the supporters, and the ferrule.

Advantageous Effects of Invention

According to the present invention, a plurality of light emitting elements or a plurality of light receiving elements can be optically coupled suitably to a plurality of optical transmission members even when an optical receptacle and a ferrule are fixed to a substrate using an adhesive.

BRIEF DESCRIPTION OF DRAWINGS

FIGS. 3A to 3E illustrate a configuration of an optical receptacle;

DESCRIPTION OF EMBODIMENTS

Hereinafter, embodiments of the present invention will be described in detail with reference to the accompanying drawings.

(Configuration of Optical Module)

Figure 1A:
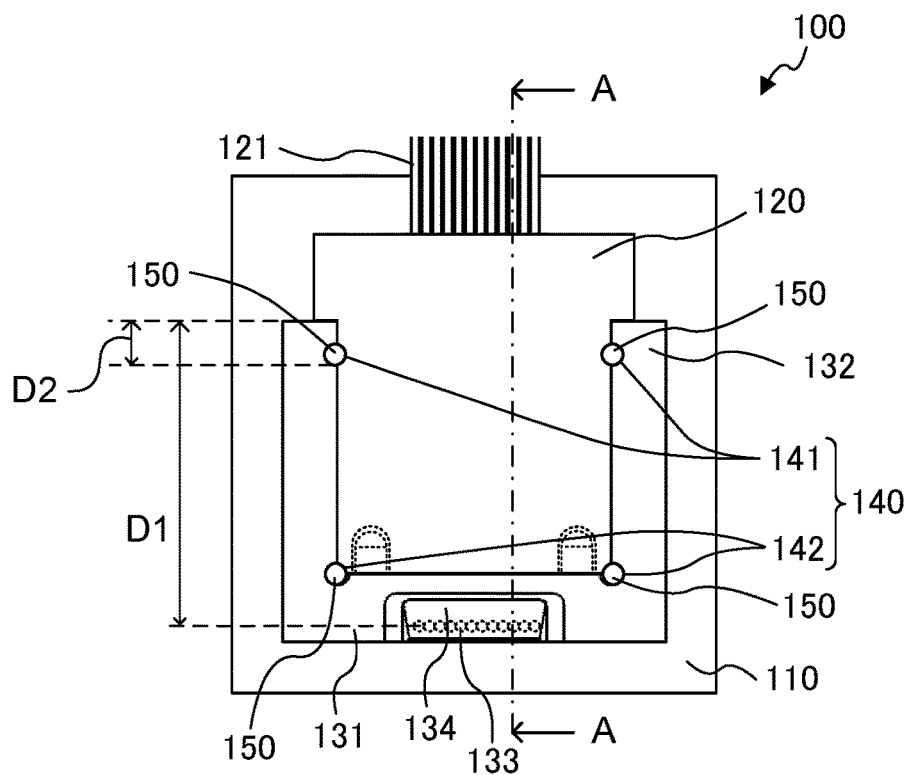
FIGS. 1A and 1B illustrate a configuration of an optical module according to an embodiment of the present invention.
Figure 1B:
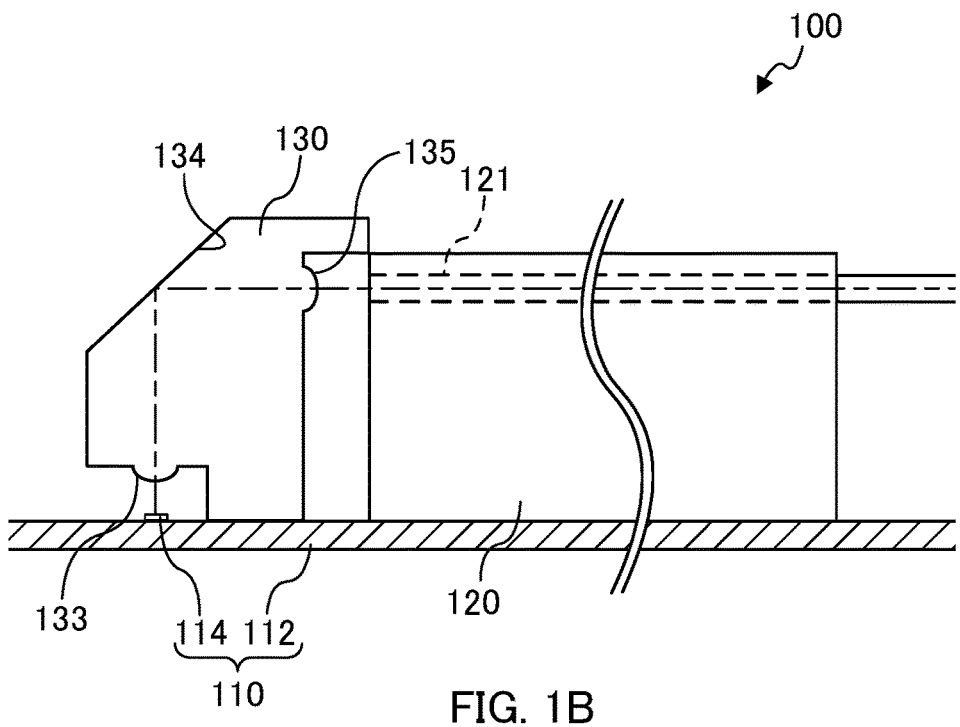

FIGS. 1A and 1B illustrate the configuration of optical module 100 according to an embodiment of the present invention. FIG. 1A is a plan view of optical module 100, and FIG. 1B is a cross-sectional view along line A-A illustrated in FIG. 1A. Note that, in FIG. 1B, hatching is omitted in the cross-section of optical receptacle 130 to show an optical path in optical receptacle 130.

As illustrated in FIGS. 1A and 1B, optical module 100 includes substrate-mounted photoelectric conversion device 110 including substrate 112 and light emitting elements 114, ferrule 120 holding optical transmission members 121, optical receptacle 130 which includes optical receptacle body 131 and two supporters 132 and is configured to optically couple light emitting elements 114 to end surfaces of optical transmission members 121, through holes 140 for fixing ferrule 120 and optical receptacle 130 to substrate 112 of photoelectric conversion device 110, and adhesive 150 filled into through holes 140. In optical module 100, optical receptacle 130 is fixed (adhered) onto photoelectric conversion device 110 (substrate 112) with adhesive 150, and ferrule 120 holding optical transmission members 121 is fixed to optical receptacle 130 with adhesive cured product 150. Thus, optical module 100 in which light emitting elements 114 and optical transmission members 121 are optically coupled together is used.

Photoelectric conversion device 110 includes substrate 112 and a plurality of light emitting elements 114. Substrate 112 is a plate-like member. A plurality of light emitting elements 114 are arrayed on substrate 112. Further, ferrule 120 and optical receptacle 130 are fixed (adhered) to substrate 112 with an adhesive. The mode in which light emitting elements 114 are arrayed on substrate 112 is not particularly limited. In the present embodiment, light emitting elements 114 are disposed in a line on substrate 112 so as to emit laser light in the direction perpendicular to the surface of substrate 112. Light emitting element 114 is, e.g., Vertical Cavity Surface Emitting Laser (VCSEL).

Figure 2A:
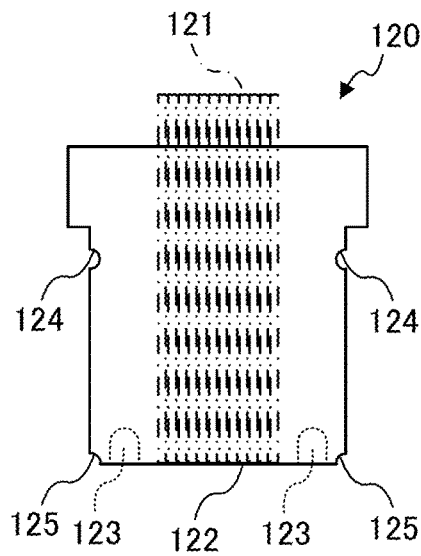
FIGS. 2A to 2D illustrate a configuration of a ferrule.
Figure 2C:
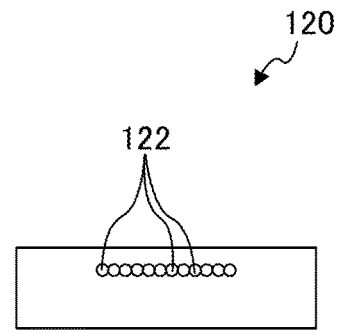
Figure 2B:
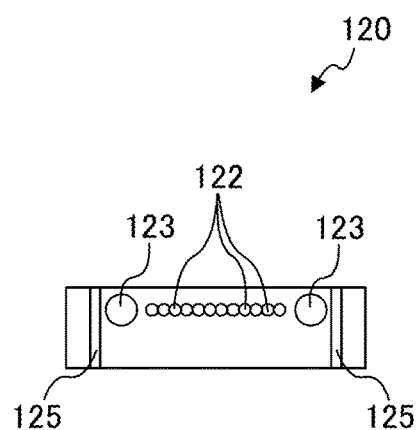
Figure 2D:
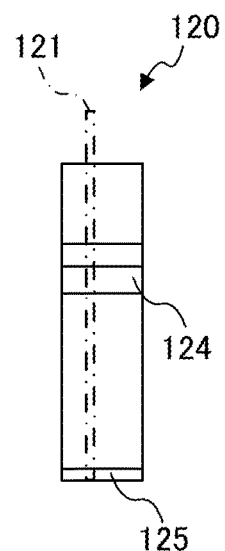

FIGS. 2A to 2D illustrate the configuration of ferrule 120. FIGS. 2A, 2B, 2C, and 2D are, respectively, a plan view, a front view, a rear view, and a right side view of ferrule 120. In FIGS. 2A and 2D, optical transmission members 121 are illustrated by dashed-dotted lines.

As illustrated in FIGS. 2A to 2D, ferrule 120 holds a plurality of optical transmission members 121. Ferrule 120 is a substantially rectangular member having a predetermined thickness, and is fixed to the rear surface side of optical receptacle 130 (the rear surface of optical receptacle body 131). Ferrule 120 includes insertion ports 122, recesses 123, two first cutout grooves 124 and two second cutout grooves 125. Ferrule 120 can be molded by injection molding (transfer molding as necessary) using a thermosetting resin such as epoxy resin or a thermoplastic resin such as PPST, for example.

Optical transmission member 121 is inserted into insertion port 122. The shape of insertion port 122 may be in any shape as long as insertion port 122 can hold optical transmission member 121 so as to receive light emitted from optical receptacle 130. Insertion port 122 may either be a through hole or a bottomed recess. In the present embodiment, insertion port 122 is a through hole opening at the front surface and the rear surface of ferrule 120 and being parallel to the surface of substrate 112. The number of insertion ports 122 and the mode in which insertion ports 122 are arrayed are not particularly limited. In the present embodiment, insertion ports 122 are disposed in a line with the same number as that (twelve) of optical transmission members 121.

Recess 123 is designed to position ferrule 120 to optical receptacle 130. The shape of recess 123 is a shape complementary to projection 136 disposed on optical receptacle 130. The number of recesses 123 is the same as that of projection 136. In the present embodiment, two recesses 123 are disposed such that arrayed insertion ports 122 are disposed therebetween.

Two first cutout grooves 124 are disposed at both side surfaces of supporter 132 on the tip portion side. First cutout groove 124 is disposed along the direction perpendicular to the axial direction of insertion port 122 when ferrule 120 is viewed laterally (see FIG. 2D). The cross-sectional shape of first cutout groove 124 parallel to the surface of substrate 112 is ½ of a circle (semicircle). First cutout groove 124 is disposed to face third cutout groove 137 to be described later in optical module 100. First cutout groove 124 constitutes first through hole 141 together with third cutout groove 137 in optical module 100.

Two first cutout grooves 125 are disposed at both ends of the side surface on optical receptacle body 131 side (on the base end side of supporter 132). Second cutout groove 125 is disposed along the direction perpendicular to the axial direction of insertion port 122 when ferrule 120 is viewed laterally (see FIG. 2D). The cross-sectional shape of second cutout groove 125 parallel to the surface of substrate 112 is ¼ of a circle (sector). Second cutout groove 125 is disposed to face fourth cutout groove 138 to be described later in optical module 100. Second cutout groove 125 constitutes second through hole 142 together with fourth cutout groove 138 in optical module 100.

Optical transmission members 121 receive light emitted from optical receptacle 130. The end portions of optical transmission members 121 are held by ferrule 120. Thus, optical transmission members 121 are disposed at such positions where optical transmission members 121 can receive light emitted from optical receptacle 130. The number of optical transmission members 121 and the mode in which optical transmission members 121 are arrayed are not particularly limited. In the present embodiment, twelve optical transmission members 121 are disposed in a line in parallel with the surface of substrate 112 so as to receive light emitted from optical receptacle 130. The type of optical transmission members 121 is not particularly limited, and examples thereof include optical fibers and light waveguides. In the present embodiment, optical transmission members 121 are optical fibers. The optical fibers may be single-mode optical fibers or multi-mode optical fibers.

FIGS. 3A to 3E illustrate the configuration of optical receptacle 130 according to an embodiment. FIGS. 3A, 3B, 3C, 3D, and 3E are, respectively, a plan view, a bottom view, a front view, a rear view, and a right side view of the optical receptacle.

As illustrated in FIGS. 3A to 3E, optical receptacle 130 is a squarely U-shaped member when viewed in plan view. Optical receptacle 130 includes optical receptacle body 131 and two supporters 132. Optical receptacle body 131 and supporters 132 together have a plane symmetrical shape with respect to a symmetry plane parallel to the optical axis of light emitted from each of second optical surfaces 135.

Optical receptacle body 131 is light transmissive, and is configured such that light emitted from light emitting element 114 is incident thereon and that optical receptacle body 131 emits the incident light toward the end surface of optical transmission member 121. The shape of optical receptacle body 131 is a substantially rectangular parallelepiped. Optical receptacle body 131 includes a plurality of first optical surfaces (incidence surfaces) 133, third optical surface (reflection surface) 134, a plurality of second optical surfaces (emission surfaces) 135, and two projections 136. Optical receptacle body 131 is formed of a material transmitting light with a wavelength used for optical communications. Examples of the materials include transparent resins such as polyetherimide (PEI) and cyclic olefin resins. Optical receptacle body 131 can be made by injection molding, for example.

First optical surface 133 is an incidence surface that refracts laser light emitted from light emitting element 114 to allow the light to enter inside optical receptacle body 131. The number of first optical surfaces 133 and the mode in which first optical surfaces 133 are arrayed are not particularly limited. A plurality of first optical surfaces 133 may be arrayed either in a line or in two or more lines. In the present embodiment, twelve first optical surfaces 133 are disposed in a line on the bottom surface side of optical receptacle body 131 so as to face respective light emitting elements 114. First optical surface 133 may be in any shape. In the present embodiment, the shape of first optical surface 133 is that of a convex lens protruding toward light emitting element 114. The shape of first optical surface 133 in plan view is a circle. The central axis of first optical surface 133 is preferably perpendicular to the light emitting surface of light emitting element 114 (and to the surface of substrate 112). Further, the central axis of first optical surface 133 preferably coincides with the optical axis of the laser light emitted from light emitting element 114. The light incident on first optical surface 133 (incidence surface) propagates toward third optical surface 134 (reflection surface).

Third optical surface 134 is a reflection surface that reflects the light incident on first optical surface 133 toward second optical surface 135. Third optical surface 134 is tilted such that the distance from optical transmission member 121 decreases in the direction from the bottom surface to the top surface of optical receptacle body 131. The inclination angle of third optical surface 134 relative to the optical axis of light emitted from light emitting element 114 is not particularly limited. In the present embodiment, the inclination angle of third optical surface 134 is 45° relative to the optical axis of light incident on first optical surface 133. Third optical surface 134 may be in any shape. In the present embodiment, the shape of third optical surface 134 is a flat surface. The light incident on first optical surface 133 is incident on third optical surface 134 at an incident angle larger than the critical angle. Third optical surface 134 totally reflects the incident light toward second optical surface 135. That is, light with a predetermined light flux diameter is incident on third optical surface 134 (reflection surface), and the light with the predetermined light flux diameter is emitted toward second optical surface 135 (emission surface) from third optical surface 134.

Second optical surface 135 is an emission surface that emits the light totally reflected by third optical surface 134 toward the end surface of optical transmission member 121. The number of second optical surfaces 135 and the mode in which second optical surfaces 135 are arrayed are not particularly limited. A plurality of second optical surfaces 135 may be arrayed either in a line or in two or more lines. In the present embodiment, twelve second optical surfaces 135 are disposed in a line on the rear surface of optical receptacle body 131 so as to face respective end surfaces of optical transmission members 121. Second optical surface 135 may be in any shape. In the present embodiment, the shape of second optical surface 135 is that of a convex lens protruding toward the end surface of optical transmission member 121. This enables the light having the predetermined light flux diameter reflected by third optical surface 134 to be efficiently coupled to the end surface of optical transmission member 121. The central axis of second optical surface 135 preferably coincides with the central axis of the end surface of optical transmission member 121.

Two projections 136 are disposed on the rear surface of the optical receptacle body 131. Two projections 136 are disposed at positions corresponding to recesses 123, respectively. Optical transmission members 121 can be positioned to optical receptacle body 131 by respectively engaging two projections 136 of optical receptacle body 131 with two recesses 123 in ferrule 120 holding optical transmission members 121.

Supporters 132 have the shape of a substantially rectangular parallelepiped, and are disposed on both sides of ferrule 120 fixed to the rear surface of optical receptacle body 131. The base ends (front surface) of supporters 132 are connected to the both ends of optical receptacle body 131, respectively. That is, supporter 132 is disposed in a direction the same as the optical axis of light emitted from second optical surface 135. Supporter 132 may be formed of the same light transmissive material as optical receptacle body 131, or of a different non-light transmissive material. For example, supporters 132 can be integrally formed with optical receptacle 130 by injection molding using the same material. Supporter 132 has two third cutout grooves 137 and two fourth cutout grooves 138.

Third cutout groove 137 is disposed at a tip portion on a side surface of supporter 132 on ferrule 120 side. Specifically, third cutout groove 137 is preferably disposed at a position within 20%, which is a distance from the tip of supporter 132, of a distance from the tip of supporter 132 to the center of first optical surface 133 in the optical axis direction of light emitted from second optical surface 135. The cross-sectional shape of third cutout groove 137 in the same direction as the optical axis of the light emitted from second optical surface 135 is not particularly limited. In the present embodiment, the cross-sectional shape of third cutout groove 137 parallel to the surface of substrate 112 is ½ of a circle (semicircle). Third cutout groove 137 is disposed to face the above-mentioned first cutout groove 124 in optical module 100. Further, third cutout groove 137 constitutes first through hole 141 together with first cutout groove 124 in optical module 100.

Fourth cutout groove 138 is disposed at a connection portion between optical receptacle body 131 and supporter 132 and at a side surface of supporter 132 on ferrule 120 side. The cross-sectional shape of fourth cutout groove 138 in the same direction as the optical axis of the light emitted from second optical surface 135 is not particularly limited. In the present embodiment, the cross-sectional shape of fourth cutout groove 138 parallel to the surface of substrate 112 is ¾ of a circle (sector). Fourth cutout groove 138 is disposed to face the above-mentioned second cutout groove 125 in optical module 100. Further, the inner surface of fourth cutout groove 138 constitutes second through hole 142 together with second cutout groove 125 in optical module 100.

Returning to the description of optical module 100, an adhesive is retained in through hole 140 in order to mount (fix) ferrule 120 and optical receptacle 130 onto substrate 112. Therefore, through hole 140 is filled with adhesive cured product 150. As illustrated in FIG. 1A, through holes 140 include two first through holes 141 and two second through holes 142. By fixing ferrule 120 to optical receptacle 130, first cutout groove 124 and third cutout groove 137 constitute first through hole 141, and second cutout groove 125 and fourth cutout groove 138 constitute second through hole 142.

First through hole 141 is disposed at a boundary between ferrule 120 and supporter 132. The inner surface of first through hole 141 includes the inner surface of first cutout groove 124 and the inner surface of third cutout groove 137. The inner surface of first through hole 141 on ferrule 120 side is the inner surface of first cutout groove 124, and the inner surface of first through hole 141 on supporter 132 side is the inner surface of third cutout groove 137. First through hole 141 is disposed at a tip portion of supporter 132. Specifically, first through hole 141 is preferably disposed at a position within 20%, which is a distance D2 from the tip of supporter 132, of a distance D1 from the tip of supporter 132 to the center of first optical surface 133 in the optical axis direction of light between second optical surface 135 and the plurality of optical transmission members 121 (see FIG. 1A). The shape of first through hole 141 may be in any shape. In the present embodiment, the shape of first through hole 141 is a cylindrical shape. The opening of first through hole 141 may have any size. The size of the opening of first through hole 141 can be appropriately set depending on the material or size of optical receptacle 130 and ferrule 120 or the nature of the adhesive to be filled. The adhesive is not particularly limited as long as the adhesive can adhere optical receptacle 130 onto photoelectric conversion device 110 (substrate 112) without deformation. For example, the adhesive may be a filler to fill first through hole 141, or a sealant charged into first through hole 141. Further, known thermosetting epoxy resin adhesives, ultraviolet curable resin adhesives, or the like can also be used.

Second through hole 142 is disposed at a boundary among ferrule 120, supporter 132, and optical receptacle body 131. The inner surface of second through hole 142 includes the inner surface of second cutout groove 125 and the inner surface of fourth cutout groove 138. The inner surface of second through hole 142 on ferrule 120 side is the inner surface of second cutout groove 125, and the inner surface of second through hole 142 on supporter 132 side is the inner surface of fourth cutout groove 138. The shape of second through hole 142 may be in any shape. In the present embodiment, the shape of second through hole 142 is a cylindrical shape. The opening of second through hole 142 may have any size. The size of the opening of second through hole 142 can be appropriately set depending on the material or size of optical receptacle 130 and ferrule 120 or the nature of the adhesive to be filled. As the adhesive to fill second through hole 142, the same adhesive as that to fill first through hole 141 can be used.

Ferrule 120 and optical receptacle 130 are fixed to substrate 112 by positioning ferrule 120 and optical receptacle 130 on substrate 112, then filling an adhesive into through holes 140 (two first through holes 141 and two second through holes 142), and curing the adhesive.

More specifically, optical receptacle 130 is positioned on substrate 112 such that the central axis of each first optical surface 133 coincides with the optical axis of laser light emitted from corresponding light emitting element 114. Next, ferrule 120 is positioned relative to optical receptacle 130 such that the central axis of each second optical surface 135 coincides with the central axis of the light receiving surface of optical transmission member 121. Then, first through hole 141 and second through hole 142 are filled with an adhesive such that the adhesive is brought in contact with the entire circumferences of the inner peripheral surfaces of first through hole 141 and second through hole 142 as well as with substrate 112, and subsequently the adhesive is cured. When a thermosetting epoxy resin adhesive is used, for example, the adhesive is heated. These steps enable optical receptacle 130 and ferrule 120 to be fixed to substrate 112. Note that ferrule 120 and optical receptacle 130 may be positioned on substrate 112 after ferrule 120 is positioned relative to optical receptacle 130.

Figure 4A:
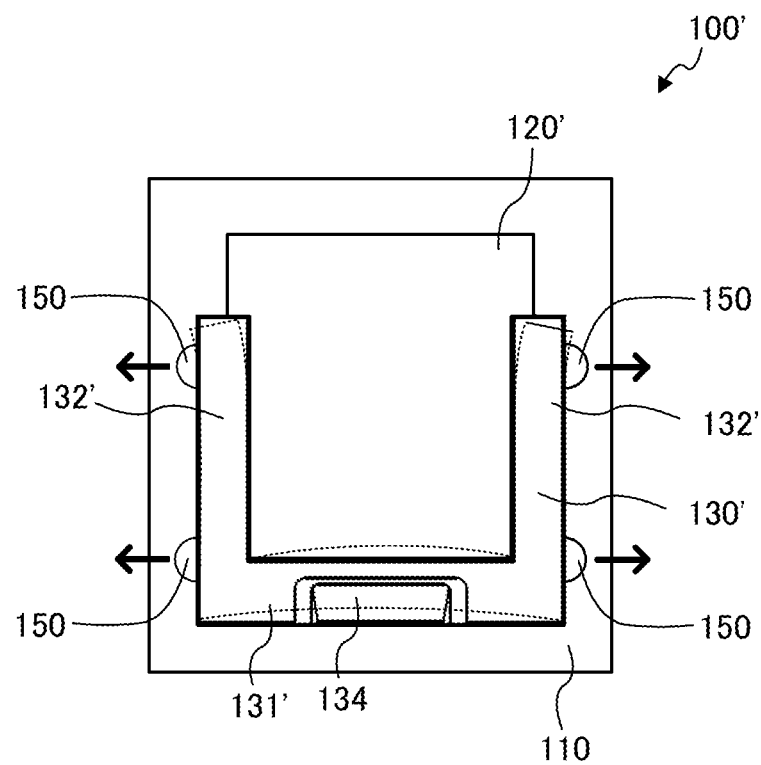
FIGS. 4A and 4B illustrate deforming directions of optical modules at the time of curing an adhesive.
Figure 4B:
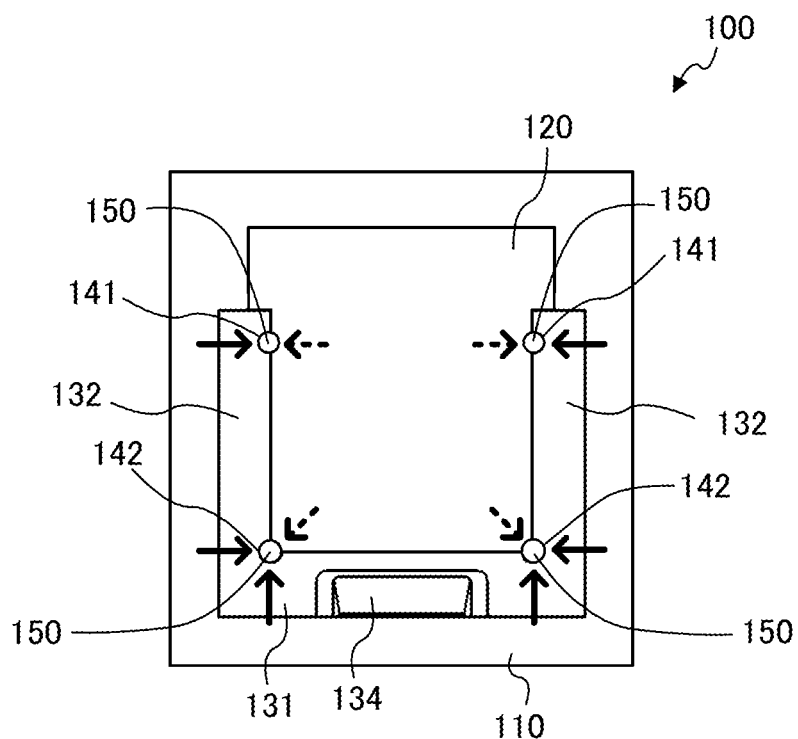

FIGS. 4A and 4B illustrate deforming directions of optical module 100 (optical receptacle 130 and ferrule 120) at the time of curing the adhesive. FIG. 4A is a schematic view illustrating deforming directions of optical module 100' without through holes 140 when the adhesive is put on the outside of optical receptacle 130'. FIG. 4B is a schematic view illustrating deforming directions of optical module 100 according to the present invention. Note that optical transmission member 121 is omitted in FIGS. 4A and 4B.

As indicated by solid arrows in FIG. 4A, when the outer side surface of supporter 132' is fixed with an adhesive in optical module 100' including optical receptacle 130' without through holes 140, supporter 132' is undesirably deformed as if it is pulled outward (toward adhesive cured product 150 side). At that time, optical receptacle body 131' is connected to the base end of supporter 132', and thus the tip side is undesirably deformed more largely than the base end side. In addition, in association with the outward deformation of supporter 132', optical receptacle body 131' is undesirably deformed to be convex toward ferrule 120' side.

On the other hand, as illustrated in FIG. 4B, in optical module 100 according to the present embodiment, ferrule 120 (the inner surface of first cutout grove 124; see dashed arrows) and supporter 132 (the inner surface of third cutout grove 137; see solid arrows) which are in contact with adhesive cured product 150 are pulled toward the center of first through hole 141 by the shrinkage of the adhesive caused by the curing. Further, as illustrated in FIG. 4B, ferrule 120 (the inner surface of second cutout grove 125; see dashed arrows), optical receptacle body 131, and supporter 132 (the inner surface of fourth cutout grove 138; see solid arrows) which are in contact with the adhesive are pulled toward the center of second through hole 142 by the shrinkage of the adhesive caused by the curing. In the present embodiment, the adhesive is in contact with the inner peripheral surface of through hole 141. Thus, forces in a planar direction derived from the adhesive shrinkage, which cause deformation of ferrule 120 and optical receptacle 130, are offset by each other. Accordingly, it can be found that, by reducing the deformation of optical receptacle body 131 toward ferrule 120 side, first optical surface 133, second optical surface 135, and third optical surface 134 are less likely to be deformed, so that the deformation of optical module 100 can be reduced.

(Simulation)

Next, the deformation of the optical receptacle body toward the ferrule side was studied. The moving distances of first optical surface 133 (deformation amount of optical receptacle 130) were simulated for optical module 100 according to the present invention when the optical module 100 was fixed with a thermosetting epoxy resin adhesive (after heating). The moving distances of each of first optical surfaces 133 in a planer direction (X axis direction) by heating were analyzed by a finite element method. For comparison, module 100' without through holes 140 was also simulated. Parameters set for the simulation are shown in Table 1. The curing temperature and curing time of the thermosetting epoxy resin adhesive were set at 100° C. and at 1 hour, respectively, in the simulation. Further, first through hole 141 was disposed at a position within 14%, which is a distance from the tip of supporter 132, of a distance from the tip of supporter 132 to the center of first optical surface 133. Since the optical receptacle has a plane symmetrical shape with respect to a symmetry plane, only the right half of the optical receptacle was simulated. First optical surfaces 133 were numbered 1 to 12 with first optical surface 133 at the right most side as number one. Therefore, the moving distances of first optical surfaces 133 with numbers 7 to 12 were simulated.

TABLE 1

| Material | Substrate Glass epoxy | Optical Receptacle Polyetherimide | Ferrule Epoxy resin | Adhesive Thermosetting epoxy resin adhesive |
|---|---|---|---|---|
| Young's modulus (GPa) | 24.6 | 3.4 | 22 | 8.8 |
| Poisson's ratio | 0.2 | 0.4 | 0.3 | 0.3 |
| Linear expansion coefficient (/° C.) | $1.1 \times 10^{-5}$ | $5.6 \times 10^{-5}$ | $1.1 \times 10^{-5}$ | $4.0 \times 10^{-5}$ |

Figure 5:
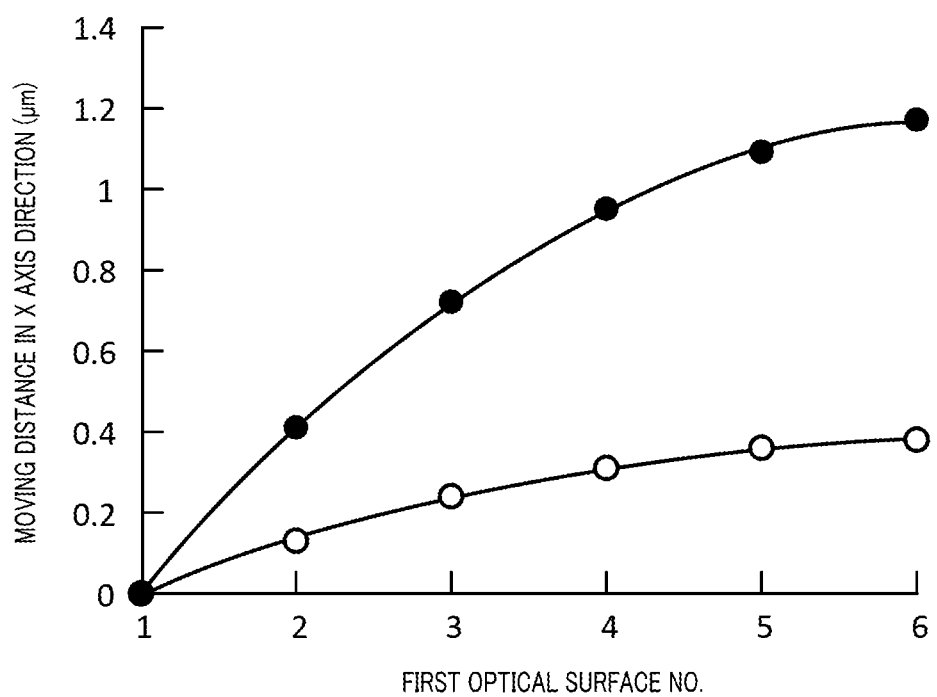
FIG. 5 shows simulation results of the deformation of the optical module.

FIG. 5 is a graph showing the relationship between first optical surface (incidence surface) numbers and the respective moving distances of first optical surfaces caused by the curing of the adhesive. As used herein, "X axis direction" refers to the direction along the central axis of the second optical surface (vertical direction in FIGS. 3A and 3B). In the graph, the abscissa represents the numbers of the first optical surfaces given as described above. The ordinate represents the moving distance of the first optical surface 133 from a position before curing the adhesive to a position after curing the adhesive. Black circle symbols show simulation results for optical module 100' of Comparative Example in FIG. 4A, whereas white circle symbols show simulation results for optical module 100 according to the present invention in FIGS. 1A and 1B.

As shown in FIG. 5, movements of first optical surfaces 133 in optical module 100' of Comparative Example without through holes 140 by the curing of the adhesive were large in X axis direction. On the other hand, movements of first optical surfaces 133 in optical module 100 having through holes 140 were reduced. The moving distances in X axis direction did not change significantly when the center of first through hole 141 was at a position within 20%, from the tip of supporter 132, of a distance from the tip of supporter 132 to the center of first optical surface 133.

(Effects)

As described above, optical module 100 according to the present invention includes two first through holes 141 each disposed at a tip portion of supporter 132 and having an inner surface surrounded by supporter 132 and ferrule 120, and two second through holes 142 each having an inner surface surrounded by supporter 132, ferrule 120, and optical receptacle body 131. Thus, forces in a planar direction derived from the adhesive shrinkage, which cause deformation of ferrule 120 and optical receptacle 130, are offset by each other. Accordingly, the deformation of optical module 100 according to the present invention can be reduced even when optical receptacle 130 and ferrule 120 are fixed to substrate 112 using an adhesive.

Note that a plurality of first optical surfaces 133 may be disposed on the front side of optical receptacle body 131, and a plurality of second optical surfaces 135 may be disposed on the rear side of optical receptacle body 131 so as to face first optical surfaces 133. In this case, a reflection surface is unnecessary. Further, first through hole 141 is disposed at a tip portion of supporter 132.

Optical module 100 according to the embodiments may monitor output of laser light (e.g., intensity and amount of the light) emitted from light emitting elements 114. In this case, photoelectric conversion device 110 of optical module 100 includes substrate 112, light emitting element 114, a light receiving element disposed on substrate 112, and a control section that controls output of laser light emitted from light emitting element 114 based on the intensity and amount of monitoring light received by the light receiving element, although not illustrated. Optical receptacle 130 further includes a separating section that separates light incident on the first optical surface into signal light propagating toward optical transmission member 121 and monitoring light propagating toward the light receiving element.

In the above embodiments, first optical surface 133 and second optical surface 135 in the optical receptacle are convex lenses, but first optical surface 133 and second optical surface 135 may be flat surfaces. Specifically, only first optical surface 133 may be a flat surface, or only second optical surface 135 may be a flat surface. When first optical surface 133 is formed in a flat surface, third optical surface 134 is formed to function as a concave mirror, for example. When light immediately before reaching second optical surface 135 is effectively converged by first optical surface 133, third optical surface 134 or the like, second optical surface 135 may be formed in a flat surface.

Further, the optical receptacle according to any one of the embodiments may be used also for an optical module on receiving side. In this case, the receiving optical module includes a plurality of light receiving elements for receiving light instead of the plurality of light emitting elements 114. The light receiving elements are arrayed on the same positions as the respective corresponding light emitting elements. The receiving optical module has second optical surfaces 135 as incidence surfaces, and first optical surfaces 133 as emission surfaces. Light emitted from the end surface of optical transmission member 121 enters the optical receptacle from second optical surface 135. The light having entered the optical receptacle is reflected by third optical surface 134 to be emitted from first optical surface 133 toward the light receiving element. In the case of an optical module not having a reflection surface, light having entered the optical receptacle is emitted from first optical surface 133 toward the light receiving element.

This application is entitled to and claims the benefit of Japanese Patent Application No. 2013-265288, filed on Dec. 24, 2013, the disclosure of which including the specification, drawings and abstract is incorporated herein by reference in its entirety.

INDUSTRIAL APPLICABILITY

The optical module according to the present invention is advantageous for optical communications using optical transmission members.

REFERENCE SIGN LIST 100, 100' Optical module
110 Photoelectric conversion device
112 Substrate
114 Light emitting element 120, 120' Ferrule
121 Optical transmission member
122 Insertion port
123 Recess
124 First cutout groove
125 Second cutout groove
130, 130' Optical receptacle
131, 131' Optical receptacle body
132, 132' Supporter
133 First optical surface
134 Third optical surface
135 Second optical surface
136 Projection
137 Third cutout groove
138 Fourth cutout groove
140 Through hole
141 First through hole
142 Second through hole
150 Adhesive cured product (adhesive)

The invention claimed is:

1. An optical module, comprising:
a substrate;
a plurality of light emitting elements or a plurality of light receiving elements arrayed on the substrate;
a ferrule which holds a plurality of optical transmission members being configured to receive light respectively from the plurality of light emitting elements or to emit light respectively to the plurality of light receiving elements;
an optical receptacle which is disposed on the substrate, with the ferrule being fixed to the optical receptacle, the optical receptacle being configured to optically couple the plurality of light emitting elements or the plurality of light receiving elements to the plurality of optical transmission members, respectively;
four through holes formed in a boundary between the ferrule and the optical receptacle in a direction substantially perpendicular to the substrate; and
an adhesive filled into the four through holes to adhere the ferrule and the optical receptacle to the substrate, wherein:
the optical receptacle includes:
an optical receptacle body including a plurality of first optical surfaces which are configured such that light emitted from the plurality of light emitting elements is respectively incident on the first optical surface or are configured to emit light propagating inside the optical receptacle body respectively toward the plurality of light receiving elements, and a plurality of second optical surfaces which are configured to emit the light incident on the plurality of first optical surfaces respectively toward an end surface of the plurality of optical transmission members or are configured such that light from the plurality of optical transmission members is respectively incident on the second optical surface, the optical receptacle body having the ferrule being fixed to a rear surface thereof such that the plurality of optical transmission members face the plurality of second optical surfaces, respectively, and
two supporters disposed on both side surfaces of the ferrule, respectively, the two supporters each having a base end connected to the optical receptacle body, and
the four through holes include:
two first through holes each surrounded by a tip portion of each of the supporters and the ferrule, and
two second through holes each surrounded by the optical receptacle body, each of the supporters, and the ferrule.

2. The optical module according to claim 1, wherein the optical receptacle body further includes a reflection surface which is configured to reflect the light incident on the plurality of first optical surfaces toward the plurality of second optical surfaces, or to reflect the light incident on the plurality of second optical surfaces toward the plurality of first optical surfaces.

3. The optical module according to claim 2, wherein:
the plurality of first optical surfaces are disposed on a bottom surface side of the optical receptacle body,
the plurality of second optical surfaces are disposed on a rear surface side of the optical receptacle body, and
the first through hole is disposed at a position within 20% of a distance from the tip of the supporter to a center of the first optical surface in an optical axis direction of light between the plurality of second optical surfaces and the plurality of optical transmission members.

4. The optical module according to claim 1, wherein:
the plurality of first optical surfaces are disposed on a front surface side of the optical receptacle body,
the plurality of second optical surfaces are disposed on a rear surface side of the optical receptacle body, and
the first through hole is disposed at a position within 20% of a distance from the tip of the supporter to a center of the first optical surface in an optical axis direction of light between the plurality of second optical surfaces and the plurality of optical transmission members.

* * * * *